United States Patent
Schowalter et al.

(10) Patent No.: US 6,719,843 B2
(45) Date of Patent: Apr. 13, 2004

(54) POWDER METALLURGY TUNGSTEN CRUCIBLE FOR ALUMINUM NITRIDE CRYSTAL GROWTH

(75) Inventors: Leo J. Schowalter, Latham, NY (US); Glen A. Slack, Scotia, NY (US)

(73) Assignee: Crystal Is, Inc., Latham, NY (US)

( * ) Notice: Subject to any disclaimer, the term of this patent is extended or adjusted under 35 U.S.C. 154(b) by 5 days.

(21) Appl. No.: 10/251,106

(22) Filed: Sep. 20, 2002

(65) Prior Publication Data

US 2003/0127044 A1 Jul. 10, 2003

Related U.S. Application Data

(60) Provisional application No. 60/323,947, filed on Sep. 21, 2001.

(51) Int. Cl.[7] .............................................. C30B 11/14
(52) U.S. Cl. ..................... 117/220; 117/221; 117/222; 117/82; 117/83; 117/84
(58) Field of Search ................................ 117/220, 221, 117/222, 82, 83, 84

(56) References Cited

U.S. PATENT DOCUMENTS 6,187,089 B1 * 2/2001 Phillips et al.

FOREIGN PATENT DOCUMENTS

JP 2000154090 * 6/2000

OTHER PUBLICATIONS

G.A. Slack and T.F. McNell, "Growth of High Purity AlN Crystals", J. Cryst. Growth 34, 263 (1976).

G.A. Slack and T.F. McNelly, "AlN Single Crystals", J. Cryst. Growth 42, 560 (1977).

B. Raghothamachar, M. Dudley, J.C. Rojo, K. Morgan, and L.J. Schowalter, "X–ray Characterization of Bulk AlN Single Crystals Grown by the Sublimation Technique", submitted to J. Crystal Growth (2002). Presented at Am. Assoc. Crystal Growth Conference, Seattle, WA, Aug. 2002.

S.V. Nageuder Naidu and P. Rama Rao, Editors, "Phase Diagrams of Binary Tungsten Alloys, Indian Institute of Metals", Calcutta, pp. 7–13, (1991).

* cited by examiner

*Primary Examiner*—Robert Kunemund
(74) *Attorney, Agent, or Firm*—Richard L. Sampson, Esq.

(57) ABSTRACT

A crucible for growing III-nitride (e.g., aluminum nitride) single crystals is provided. The crucible includes an elongated wall structure defining an interior crystal growth cavity. The crucible includes a plurality of tungsten grains and a wall thickness of at least about 1.5 times the average tungsten grain size. In particular embodiments, the crucible includes first and second layers of tungsten grains the first layer including grains forming an inside surface thereof and the second layer being superposed with the first layer. The crucible may be machined from a bar, plate, or billet of powder metallurgy tungsten.

21 Claims, 3 Drawing Sheets

POWDER METALLURGY TUNGSTEN CRUCIBLE FOR ALUMINUM NITRIDE CRYSTAL GROWTH

This application claims the benefit of U.S. Provisional Application Ser. No. 60/323,947, entitled Powder Metallurgy Tungsten Crucible for AlN Crystal Growth, filed Sep. 21, 2001.

Part of the work leading to this invention was made under a United States Government STTR Contract (N00014–97–C-0362). The U.S. Government may have certain rights in this invention.

BACKGROUND OF THE INVENTION (1) Field of the Invention

The present invention relates generally to III-nitride semiconductors and more particularly to crucibles for growing III-nitride semiconductor substrates such as aluminum nitride (AlN). Use of the crucible of this invention may enable the growth of relatively large and high quality III-nitride single crystals.

(2) Background Information

Wide bandgap semiconductor devices, based on III-nitride semiconductors, are expected to find application in several opto-electronic technologies in the areas of short wavelength emission and detection. Aluminum nitride and high aluminum concentration alloys of aluminum nitride with gallium nitride and/or with indium nitride are potentially important III-nitride semiconductors for producing deep-UV light emitting diodes with potential applications including solid-state white lighting, sterilization and disinfectant devices, compact analytical devices for the biotechnology and pharmaceutical markets, bioagent detection systems, compact uv light sources for covert communication by the Department of Defense, and for short wavelength lasers for high density data storage. In addition, single-crystal substrates of aluminum nitride are attractive for the fabrication of III-nitride semiconductor, high power radio frequency, millimeter wave, and microwave devices needed for future wireless communication base stations and for Department of Defense applications. However, one of the factors limiting the maturation of aluminum nitride, and other III-nitride, technology has been the absence of high-quality bulk nitride substrates.

One promising method for the growth of aluminum nitride single crystals for such substrates is the sublimation-recondensation technique first developed by Slack and McNelly ("Growth of High Purity AlN Crystals", *J. Cryst. Growth* 34, 263 (1976) and "AlN Single Crystals", *J. Cryst. Growth* 42, 560 (1977)), both of which are fully incorporated by reference herein. However, one of the drawbacks that limited the maximum size of the crystals was the development of leaks in the tungsten crucibles, which ultimately lead to the failure thereof, through which aluminum gas may escape. The development of crucibles that substantially eliminates this problem may provide for the growth of relatively large aluminum nitride single crystals.

Therefore there exists a need for an improved crucible for growth of III-nitride semiconductor single crystals and in particular AlN single crystals.

SUMMARY OF THE INVENTION

One aspect of the present invention includes a sealable tungsten crucible for growing a III-nitride semiconductor crystal. The crucible includes an elongated wall structure extending in a longitudinal direction. The wall structure defines an interior crystal growth cavity and includes a plurality of tungsten grains. The wall structure has a thickness dimension extending in a direction substantially perpendicular to the longitudinal direction, the thickness dimension being at least about 1.5 times the average tungsten grain size.

In another aspect, this invention includes a sealable tungsten crucible for growing a III-nitride semiconductor crystal. The crucible includes an elongated wall structure extending in a longitudinal direction. The wall structure defines an interior crystal growth cavity and includes a plurality of tungsten grains. The grains effectively form at least first and second layers, the first layer including grains disposed on an inside surface of the crucible and the second layer being adjacent to the first layer.

In still another aspect, this invention includes a method for fabricating a tungsten crucible for use in growing aluminum nitride single crystals. The method includes providing a bar of powder metallurgy tungsten and machining an elongated wall structure extending in a longitudinal direction. The wall structure defines an interior crystal growth cavity and includes a plurality of tungsten grains. The grains effectively form at least first and second layers, the first layer including grains disposed on an inside surface of the crucible and the second layer being adjacent to the first layer.

In yet another aspect, this invention includes a method for fabricating an aluminum nitride single crystal. The method includes providing a tungsten crucible having an elongated wall structure extending in a longitudinal direction; the wall structure defining an interior crystal growth cavity and including a plurality of tungsten grains, which effectively form at least first and second layers, the first layer including grains disposed on an inside surface of the crucible and the second layer being adjacent the first layer. The method further includes charging the crucible with aluminum nitride, sealing the crucible, and heating at least a portion of the crucible to a temperature in excess of about 2000 degrees C.

DETAILED DESCRIPTION

Figure 3A:
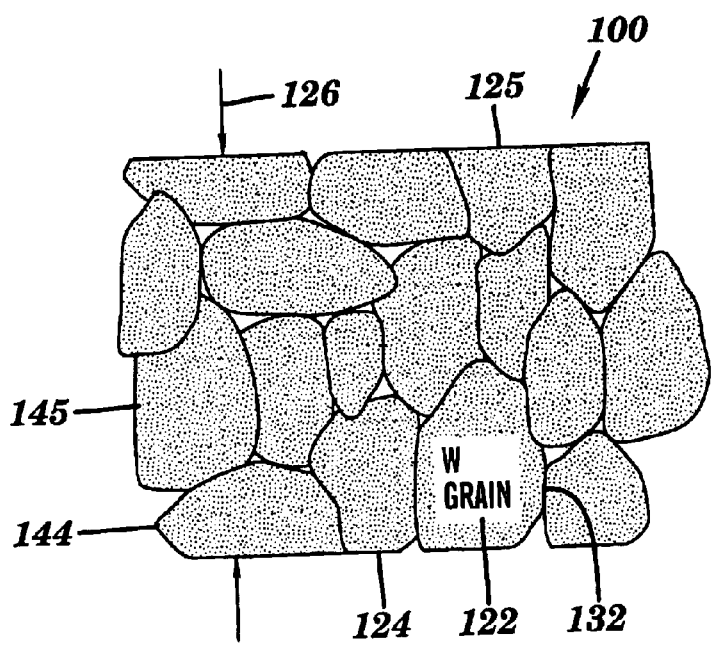
FIG. 3A is a view similar to that of FIG. 2A, of a portion of a tungsten crucible of this invention prior to grain growth.
Figure 3B:
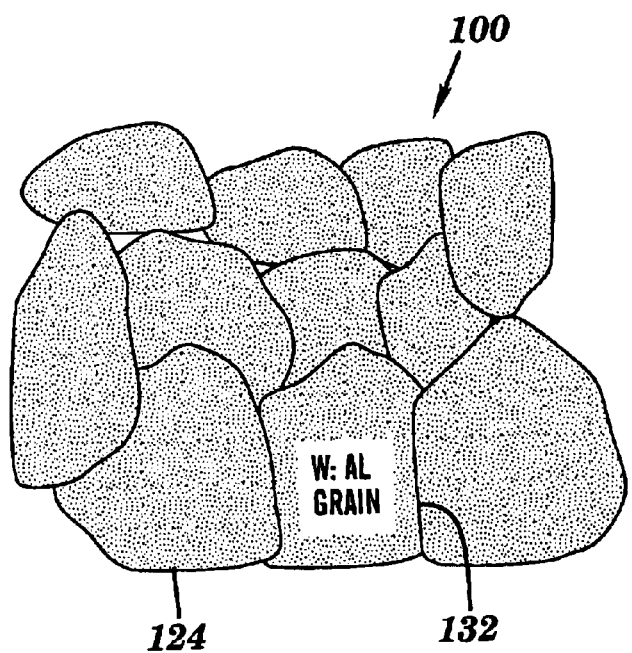
FIG. 3B is a cross sectional schematic representation of the portion of the crucible shown in FIG. 3A after exposure to Al vapor at growth temperatures.

Referring briefly to FIGS. 3A and 3B, the present invention includes a crucible that may be useful in growing relatively large aluminum nitride and/or other III-nitride single crystals for use in semiconductor applications. The tungsten crucible 100 of this invention includes a wall structure having a thickness 126 that is at least about 1.5 times, and preferably greater than about 3 times, that of the average tungsten grain 122. In one embodiment, the tungsten crucible 100 is formed using powder metallurgy techniques.

The crucible of the present invention may advantageously provide for the growth of relatively large III-nitride single crystals, and in particular may provide for the growth of AlN single crystals having a diameter in the range from about 20 to about 50 mm or greater. AlN crystals of this size may be advantageously used to fabricate relatively high quality nitride semiconductor devices with relatively better yield than prior-art approaches. These and other advantages of this invention will become evident in light of the following discussion of various embodiments thereof.

Figure 1:
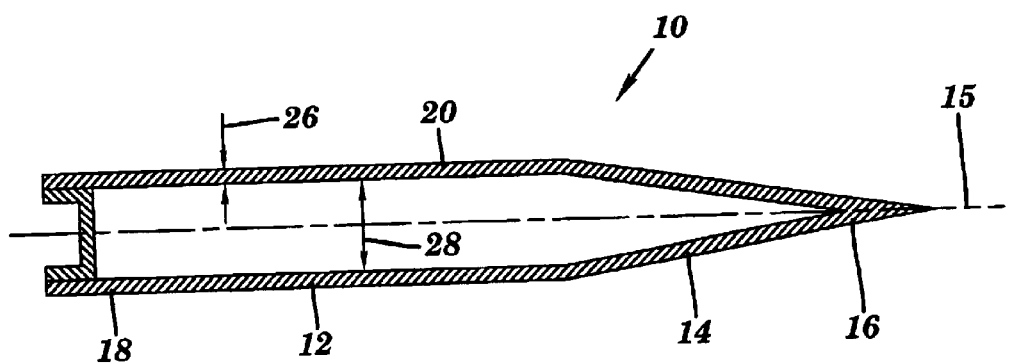
FIG. 1 is a cross-sectional schematic representation of a prior-art thin wall tungsten crucible.

Referring now to FIGS. 1–3B, prior art and the apparatus and method of the present invention are described. Referring to FIG. 1, prior-art crucible 10 typically includes a cylindrical body portion 12 and a tapered conical end portion 14 and is used in a tungsten tube furnace such as that shown in the above-referenced Slack and McNelly ("AlN Single Crystals"). To grow AlN crystals using the sublimation-recondensation technique of Slack and McNelly, the sharp tip 16 of the crucible is placed in the nominal center of the furnace at the start of run with a charge of AlN (e.g., about 5 grams) placed at the opposite end 18 of the crucible 10. The crucible 10 is rotated (e.g., at about 2 revolutions per hour) about its longitudinal axis 15 and simultaneously pushed through the hot zone (i.e., the center) of the tube furnace (with end 18 moving towards tip 16) at a rate of about 0.3 mm per hour. The center of the furnace is held at a temperature of about 2250 degrees C. during the duration of the run. The total running time may be on the order of 100 hours or more.

Figure 2A:
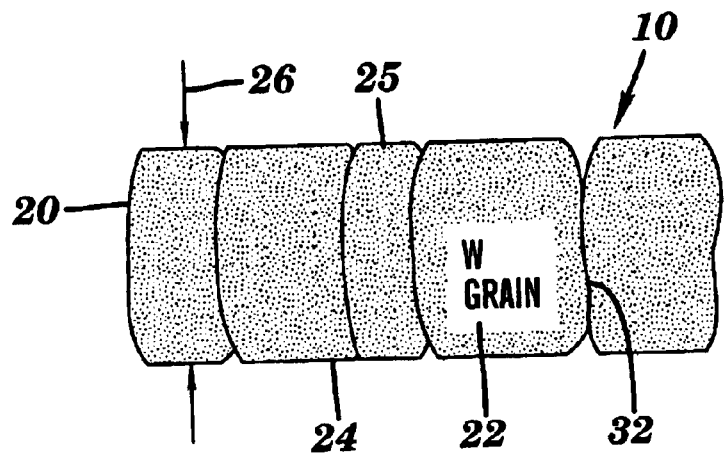
FIG. 2A is a cross-sectional schematic representation of a portion of the crucible of FIG. 1 prior to grain growth.
Figure 2B:
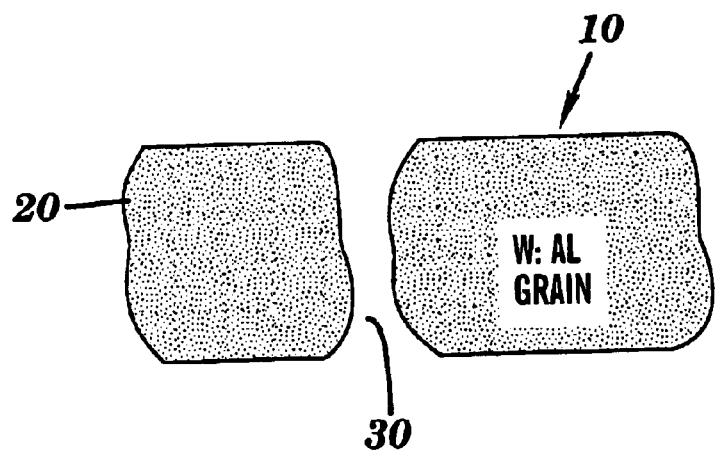
FIG. 2B is a cross-sectional schematic representation of the portion of the crucible shown in FIG. 2A after exposure to Al vapor at growth temperatures.

Referring now to FIG. 2A, these conventional crucibles 10 are formed by a chemical vapor deposition process (CVD). Crucibles 10 formed by a CVD process (e.g., using either the conventional tungsten fluoride or tungsten chloride processes) may be characterized as having a columnar grain structure in which the W grains 22 are disposed substantially perpendicular to the inner wall 24 of the crucible 10 and extend substantially the entire thickness 26 of the crucible wall 20 (i.e., from the inner wall 24 to the outer wall 25). Referring now to FIG. 2B, and as briefly described hereinabove, crucible 10 tends to develop pinhole leaks 30 at the grain boundaries 32 (FIG. 2A) thereof, which disadvantageously permit aluminum vapor to escape from the interior of the crucible 10. The pinhole leaks 30 also generally lead to crucible failure which thus limits the maximum achievable crystal size.

This problem may be circumvented, in theory, by employing single-crystal tungsten crucibles. However, such a solution is relatively difficult to implement and prohibitively expensive for commercialization.

One aspect of this invention is the realization that the above-described pinhole leak problem may be related to swelling of the tungsten grains 22 caused by the absorption of aluminum during use. Measurements conducted by the inventors have shown that after growth at 2330 degrees C. the tungsten crucible contained 5.3 atom percent aluminum (which is approximately equivalent to the saturation value of aluminum in tungsten at that temperature). At this aluminum concentration, the lattice constant was measured to decrease slightly to 3.162 angstroms from 3.165 angstroms for pure tungsten (with aluminum atoms substitutionally replacing tungsten atoms in the lattice). Thus the absorption of aluminum should theoretically result in swelling of slightly less than 5.3 volume percent, which was corroborated by an observed swelling of about 5 volume percent.

Not wishing to be bound by a particular theory, it is believed that the swelling results in pinhole 30 formation, particularly at the triple points where three tungsten grains 22 meet. Since the grains 22 of the CVD tungsten crucibles 10 are columnar and extend the thickness 26 of the crucible wall 20, the pinholes 30 likewise extend the thickness 26 of the crucible wall 20.

Referring now to FIGS. 3A and 3B, a cross sectional schematic illustration of the tungsten grain 122 structure of the crucible 100 of the present invention is illustrated. Crucible 100 is substantially similar to crucible 10 (FIG. 1) in that it may include a cylindrical body portion 12 (FIG. 1) and a tapered conical end portion 14 (FIG. 1). Crucible 100 differs from that of crucible 10 in that it utilizes a granular, multigrain structure in which the thickness 126 of the crucible wall is at least 1.5 times that of the average grain diameter. The grain structure of this invention may also be thought of as including at least two layers, a first layer 144 adjacent to (or forming) the inner wall 124 of the crucible 100 and a second layer 145 adjacent to the first layer 144. While not wishing to be bound by a particular theory it is believed that the present invention uses the normally deleterious effects of the grain swelling to advantage, to nominally block grain boundary diffusion. It is believed that once swelling has occurred along grain boundaries 132 of the first grain layer 144, further diffusion is severely hampered by the second grain layer 145, grains of which have swollen to effectively close off any diffusion pathways or pinholes along the grain boundaries of the first layer 144. Thus, any further diffusion of aluminum into the walls of the crucible generally occurs only by relatively slow bulk diffusion. Further, the three-dimensional, substantially random arrangement of the grains 122, as illustrated in FIGS. 3A and 3B, is believed to slow the formation of pinholes in any of the layers. Nevertheless, aluminum transport through any pinholes that may be formed in the first layer 144 of tungsten grains 122 is nominally sealed off by the second layer 145 (or subsequent layers) thereof.

One method of implementing this invention is to machine crucibles from a tungsten bar formed using powder metallurgy techniques. These powder metallurgy bars include tungsten grains having substantially no columnar grain structure. As stated above, this structure is believed to reduce the penetration rate of aluminum along the grain boundaries and its subsequent escape from the crucible, particularly after the tungsten grains have swelled due to the uptake of Al by bulk in-diffusion. Crucibles formed by the above described powder metallurgy technique have been demonstrated to exhibit a significantly longer life than would be expected simply by the increased wall thickness, indicating that the granular structure slows the permeation of aluminum through the crucible walls.

The artisan of ordinary skill in the art will readily recognize that there may be alternate approaches to forming a multilayered tungsten crucible wall. One such possible approach may be to fabricate crucibles using multiple CVD steps while using an agent between steps that disrupts further columnar growth of the individual tungsten grains.

The crucible of the present invention may be useful in fabricating III-nitride single crystals such as aluminum nitride for the electronics and opto-electronics applications. For example, the inventive crucible may be used in a tube furnace, such as that disclosed by Slack and McNelly as referenced hereinbove. The crucible is typically first charged with relatively pure aluminum nitride (e.g., greater than about 99%) and then sealed before inserting into the tube furnace. At least a portion of the crucible is heated to a temperature in excess of about 2000 degrees C. at which aluminum nitride crystal formation is favored.

The crucibles of the present invention have been demonstrated to successfully grow AlN crystals having a diameter of up to 20 mm and greater. Moreover, the powder metallurgy tungsten crucibles of this invention may be used to grow AlN crystals having a diameter of up to 50 mm or greater. As described hereinabove, AlN crystals of this size may be advantageously used in the fabrication of relatively high quality nitride semiconductor devices with relatively better yield than prior approaches.

Specific exemplary embodiment(s) have been disclosed herein in which a multilayered and/or three-dimensional nominally random tungsten grain structure is produced resulting in the boundaries between tungsten grains being nominally completely blocked owing to the swelling generated by aluminum absorption. In light thereof, the skilled artisan will readily recognize that any approach to tungsten crucible construction that creates multiple layers of relatively dense tungsten grains, may be considered within the spirit and scope of this invention.

Other embodiments are also envisaged in which tungsten crucibles are used with metals other than aluminum. For example, Be, Cr, Pd, Ti, Pt, Rh, Ru, and V each have high temperature solubilities in tungsten (S. V. Nagender Naidu and P. Rama Rao, Editors, *Phase Diagrams of Binary Tungsten Alloys*, Indian Institute of Metals, Calcutta, (1991)). Thus they would be expected to swell the tungsten grains and nominally stop further grain boundary diffusion in the crucible of this invention. Metals with somewhat lower solid solubility in tungsten (such as Fe) may also be effectively contained by grain swelling although the solid solubility of Fe in tungsten is less than three percent. It may also be possible to fabricate crucibles out of metals other than tungsten in which the solid solubility of the metal contained by the crucible causes the grains of the crucible to swell and thus impede further grain boundary diffusion of the metal contained therein.

The modifications to the various aspects of the present invention described hereinabove are merely exemplary. It is understood that other modifications to the illustrative embodiments will readily occur to persons with ordinary skill in the art. All such modifications and variations are deemed to be within the scope and spirit of the present invention as defined by the accompanying claims.

What is claimed is:

1. A sealable tungsten crucible for growing aluminum-nitride semiconductor crystal, said crucible comprising:
    an elongated wall structure extending in a longitudinal direction;
    said wall structure defining an interior crystal growth cavity;
    said wall structure including a plurality of tungsten grains;
    said grains being configured to swell due to aluminum absorption;
    said grains forming at least first and second layers, said first layer including grains forming an inside surface of said crucible and said second layer being superimposed with said first layer;
    said layers including diffusion pathways defined by boundaries between adjacent grains; and
    wherein diffusion pathways of said first layer are substantially obstructed by swollen grains of said second layer.

2. A sealable tungsten crucible for growing a III-nitride semiconductor crystal, said crucible comprising:
    an elongated wall structure extending in a longitudinal direction;
    said wall structure defining an interior crystal growth cavity;
    said wall structure including a plurality of tungsten grains; and
    said wall structure having a thickness dimension extending in a direction substantially perpendicular to said longitudinal direction, said thickness dimension being at least about 1.5 times the average tungsten grain size.

3. The crucible of claim 2 wherein said III-nitride semiconductor crystal is an aluminum nitride crystal.

4. The crucible of claim 3 being sized and shaped for growing an aluminum nitride single crystal using a sublimation-recondensation technique.

5. The crucible of claim 2 wherein said grains form at least first and second layers, said first layer including grains forming an inside surface of said crucible and said second layer being adjacent said first layer.

6. The crucible of claim 2 wherein diffusion pathways defined by boundaries between adjacent grains are substantially obstructed by others of said grains.

7. The crucible of claim 6, wherein said grains are configured to swell due to absorption of atoms of said III-nitride.

8. The crucible of claim 7, wherein said diffusion pathways are substantially obstructed by swollen grains.

9. The crucible of claim 2 wherein said cavity includes a substantially cylindrical portion and a tapered conical end portion.

10. The crucible of claim 2 wherein said wall structure defines a cavity having a transverse dimension ranging from about 5 to about 50 millimeters.

11. The crucible of claim 2 wherein said wall structure defines a cavity having a transverse dimension greater than about 50 millimeters.

12. The crucible of claim 2 wherein said thickness dimension is at least about three times that of the average tungsten grain diameter.

13. The crucible of claim 2 comprising powder metallurgy tungsten.

14. A sealable tungsten crucible for growing a III-nitride semiconductor crystal, said crucible comprising:
    an elongated wall structure extending in a longitudinal direction;
    said wall structure defining an interior crystal growth cavity;
    said wall structure including a plurality of tungsten grains; and
    said grains forming at least first and second layers, said first layer including grains forming an inside surface of said crucible and said second layer being superposed with said first layer.

15. The crucible of claim 14 wherein diffusion pathways defined by boundaries between adjacent grains in said first layer are substantially obstructed by grains in said second layer.

16. The crucible of claim 15, wherein said grains are configured to swell due to absorption of atoms of said III-nitride.

17. The crucible of claim 16, wherein said diffusion pathways in said first layer are substantially obstructed by swollen grains in said second layer.

18. The crucible of claim 14 being fabricated of powder metallurgy tungsten.

19. A method for fabricating a tungsten crucible for use in growing aluminum nitride single crystals, said method comprising:

machining an elongated wall structure from a bar of powder metallurgy tungsten, said wall structure extending in a longitudinal direction;

the wall structure defining an interior crystal growth cavity and including a plurality of tungsten grains;

wherein said grains form at least first and second layers, the first layer including grains forming an inside surface of the crucible and the second layer being superposed with the first layer.

20. A method for fabricating an aluminum nitride crystal, said method comprising:

depositing aluminum nitride in a crystal growth cavity of a tungsten crucible having an elongated wall structure extending in a longitudinal direction, the wall structure defining an interior crystal growth cavity and including a plurality of tungsten grains, the grains forming at least first and second layers, the first layer including grains forming an inside surface of the crucible and the second layer being superposed with the first layer;

sealing the crucible;

heating at least a portion of the crucible to a temperature in excess of about 2000 degrees C.

21. The method of claim 20 comprising enabling grains of at least the second layer to swell, the swelling substantially blocking diffusion of aluminum along diffusion pathways defined by boundaries between grains of at least the first layer.

* * * * *